(12) United States Patent  
Hsieh et al.

(10) Patent No.: US 7,417,278 B2  
(45) Date of Patent: Aug. 26, 2008

(54) METHOD TO INCREASE COUPLING RATIO OF SOURCE TO FLOATING GATE IN SPLIT-GATE FLASH

(75) Inventors: Chia-Ta Hsieh, Tainan (TW); Yai-Fen Lin, Chung Hsing Village (TW); Di-Son Kuo, Hsinchu (TW); Hung-Cheng Sung, Hsin-Chu (TW); Jack Yeh, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 440 days.

(21) Appl. No.: 11/122,726

(22) Filed: May 5, 2005

(65) Prior Publication Data

US 2005/0207264 A1    Sep. 22, 2005

Related U.S. Application Data

(60) Division of application No. 10/119,327, filed on Apr. 9, 2002, now Pat. No. 7,001,809, which is a continuation of application No. 09/679,512, filed on Oct. 6, 2000, now Pat. No. 6,380,583, which is a division of application No. 09/298,932, filed on Apr. 26, 1999, now Pat. No. 6,159,801.

(51) Int. Cl.
*H01L 29/788* (2006.01)

(52) U.S. Cl. ............... 257/315; 257/314; 257/316; 257/E29.3

(58) Field of Classification Search ......... 257/314–316, 257/321, 322, 324, 326, E29.3, E29.304–E29.307  
See application file for complete search history.

(56) References Cited

U.S. PATENT DOCUMENTS 4,814,840 A * 3/1989 Kameda ............... 257/316

(Continued)

OTHER PUBLICATIONS

"Silicon Processing forhtr VLSI Era, vol. 2: Process Integration" Wolf et al., Lattice Press 1990. pp. 327-332.

*Primary Examiner*—Matthew C Landau  
(74) *Attorney, Agent, or Firm*—Thomas, Kayden, Horstemeyer & Risley

(57) ABSTRACT

A split-gate flash memory cell having a three-dimensional source capable of three-dimensional coupling with the floating gate of the cell, as well as a method of forming the same are provided. This is accomplished by first forming an isolation trench, lining it with a conformal oxide, then filling with an isolation oxide and then etching the latter to form a three-dimensional coupling region in the upper portion of the trench. A floating gate is next formed by first filling the three-dimensional region of the trench with polysilicon and etching it. The control gate is formed over the floating gate with an intervening inter-poly oxide. The floating gate forms legs extending into the three-dimensional coupling region of the trench thereby providing a three-dimensional coupling with the source which also assumes a three-dimensional region. The leg or the side-wall of the floating gate forming the third dimension provides the extra area through which coupling between the source and the floating gate is increased. In this manner, a higher coupling ratio is achieved without an increase in the cell size while at the same time alleviating the punchthrough and junction break-down of source region by sharing gate voltage along the side-wall.

16 Claims, 13 Drawing Sheets

U.S. PATENT DOCUMENTS

| | | |
|---|---|---|
| 5,045,490 A | 9/1991 | Esquivel et al. ............. 438/259 |
| 5,162,247 A | 11/1992 | Hazani ....................... 437/43 |
| 5,173,436 A | 12/1992 | Gill et al. ..................... 437/43 |
| 5,414,287 A | 5/1995 | Hong .......................... 257/316 |
| 5,422,292 A | 6/1995 | Hong et al. ................. 438/261 |
| 5,453,637 A | 9/1995 | Fong-Chun et al. ......... 257/390 |
| 5,495,441 A | 2/1996 | Hong .................... 365/185.01 |
| 5,643,814 A | 7/1997 | Chung ....................... 438/259 |
| 5,801,083 A | 9/1998 | Yu et al. ..................... 438/424 |
| 6,008,078 A | 12/1999 | Zhang ....................... 438/164 |
| 6,071,777 A * | 6/2000 | Chen .......................... 438/257 |
| 6,159,801 A | 12/2000 | Hsieh et al. ................ 438/259 |

* cited by examiner

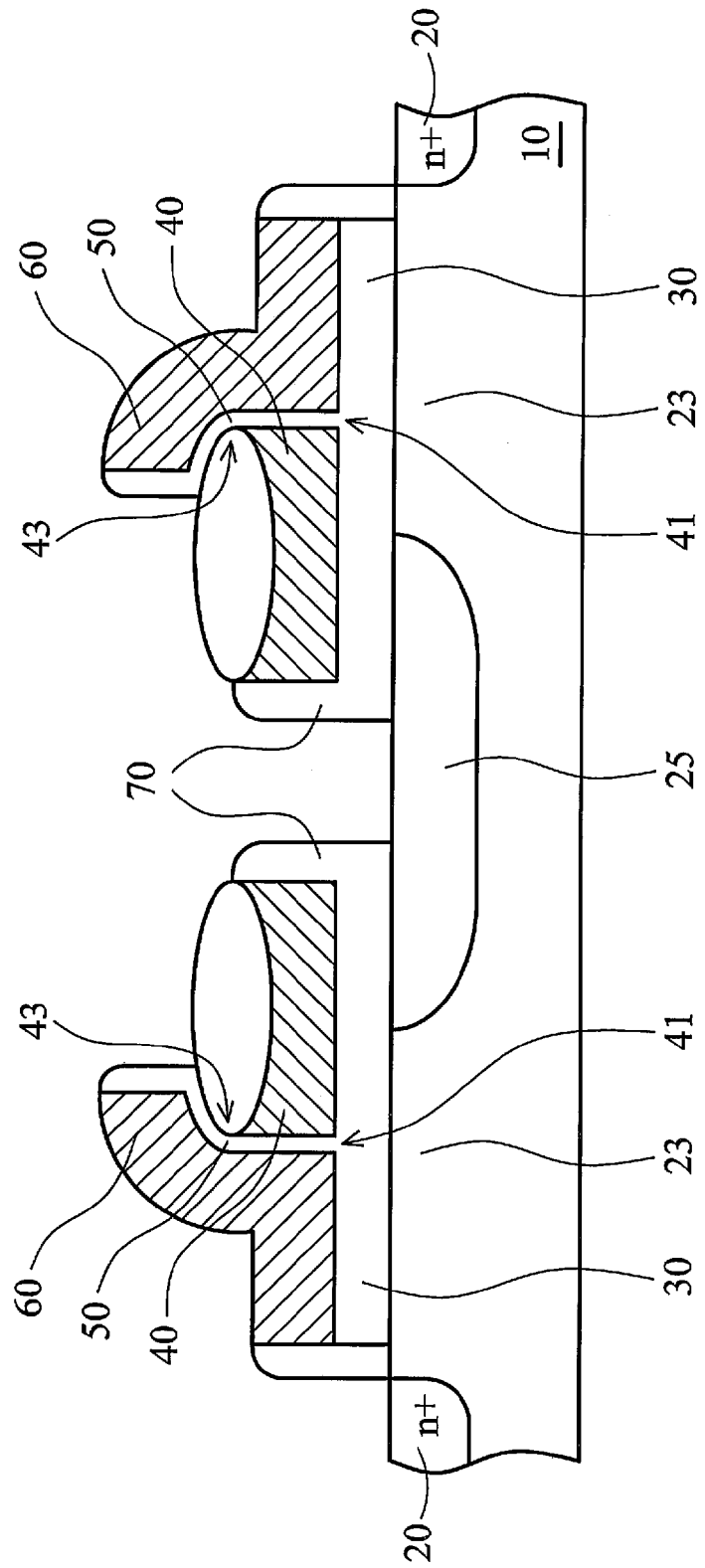
FIG. 1 - Prior Art

METHOD TO INCREASE COUPLING RATIO OF SOURCE TO FLOATING GATE IN SPLIT-GATE FLASH

CROSS-REFERENCE TO RELATED APPLICATION

This application is a divisional of U.S. patent application Ser. No. 10/119,327, filed Apr. 9, 2002, now U.S. Pat. No. 7,001,809, which is a continuation of patent application Ser. No. 09/679,512, filing date Oct. 6, 2000, now U.S. Pat. No. 6,380,583, which is a divisional of patent application Ser. No. 09/298,932, filing date Apr. 26, 1999, now U.S. Pat. No. 6,159,801.

BACKGROUND OF THE INVENTION (1) Field of the Invention

The present invention relates to the manufacturing of semiconductor memories, and in particular, directed to a split-gate flash memory having an increased coupling ratio of source to floating gate and to a method of forming of the same.

(2) Description of the Related Art

The degree of coupling between a source and floating gate in a split-gate flash memory is determined by the capacity of source implant lateral diffusion under the floating gate. It is desirable to increase the coupling ratio because that results in improved programming speed. However, trying to increase coupling ratio by increasing the source implant lateral diffusion causes the well-known problems of punch-through and junction breakdown. It is disclosed later in the embodiments of this invention a method of increasing the coupling ratio of a split-gate memory cell by extending into the trench isolation region of the cell a three-dimensional source. Because of the additional vertical wall area in the third dimension, the coupling is increased, and the performance of the cell improved.

A conventional split-gate flash memory device is characterized by its split-gate side (between the control gate and the drain) and the stacked-side (between the floating gate and the source) and by a coupling ratio between the floating gate and the source. As is known, the coupling ratio affects the program speed, that is, the larger the coupling ratio, the faster is the programming speed, and is not a fixed value by virtue of the variability of the channel length and hence that of the overlap between the floating gate and the source. Usually, if channel length is increased through greater lateral diffusion in the source region, punchthrough occurs due to excessive current well below the threshold voltage. It is shown in the present invention that the coupling ratio can be increased without increasing the channel length, but by incorporating side-wall coupling of the vertical wall in a three-dimensional source, thus alleviating the punchthrough and junction breakdown of source region by sharing gate voltage along the side-wall.

Over the years, numerous improvements in the performance as well as in the size of memory devices have been made by varying the simple, basic one-transistor memory cell, which contains one transistor and one capacitor. The variations consist of different methods of forming capacitors, with single, double or triple layers of polysilicon, and different materials for the word and bit lines. In general, memory devices include electrically erasable and electrically programmable read-only memories (EEPROMs) of flash electrically erasable and electrically programmable read-only memories (flash EEPROMs). Many types of memory cells for EEPROMs or flash EEPROMs may have source and drains regions that are aligned to a floating gate or aligned to spacers. When the source and drain regions are aligned to the floating gate, a gate electrode for a select transistor is separate from the control gate electrode of the floating gate transistor. Separate select and control gates increase the size of the memory cell. If the source and drain regions are aligned to a spacer formed after the floating gate is formed, the floating gate typically does not overlie portions of the source and drain regions. Programming and erasing performance is degraded by the offset between the floating gate and source and drain regions.

Most conventional flash-EEPROM cells use a double-polysilicon (poly) structure of which the well known split-gate cell is shown in FIG. 1. Here, two MOS transistors share a source (25). Each transistor is formed on a semiconductor substrate (10) having a first doped region (20), a second doped region (25), a channel region (23), a gate oxide (30), a floating gate (40), intergate dielectric layer (50) and control gate (60). Substrate (10) and channel region (23) have a first conductivity type, and the first (20) and second (25) doped regions have a second conductivity type that is opposite the first conductivity type.

As seen in FIG. 1, the first doped region, (20), lies within the substrate. The second doped region, (25), also lies within substrate (10) and is spaced apart form the first doped region (20). Channel region (23) lies within substrate (10) and between first (20) and second (25) doped regions. Gate oxide layer (30) overlies substrate (10). Floating gate (40), to which there is no direct electrical connection, and which overlies substrate (10), is separated from substrate (10) by a thin layer of gate oxide (30) while control gate (60), to which there is direct electrical connection, is generally positioned over the floating gate with intergate oxide (50) therebetween.

In the structure shown in FIG. 1, control gate (60) overlaps the channel region, (23 under the floating gate, (40). This structure is needed because when the cell is erased, it leaves a positive charge on the floating gate. As a result, the channel under the floating gate becomes inverted. The series MOS transistor (formed by the control gate over the channel region) is needed in order to prevent current flow from control gate to floating gate. The length of the transistor, that is the overlap of the control gate over the channel region (23) determines the cell performance. Furthermore, edges (41), (43) can affect the programming of the cell by the source size and hot electron injection through the intergate dielectric layer (50) at such edges. Hot electron injection is further affected by, what is called, gate bird's beak (43) that is formed in conventional cells. On the other hand, it will be known to those skilled in the art that corners such as (41) can affect the source coupling ratio also. Any such adverse effects attributable source size can be alleviated as disclosed later in the embodiments of this invention.

To program the transistor shown in FIG. 1, charge is transferred from substrate (10) through gate oxide (30) and is stored on floating gate (40) of the transistor. The amount of charge is set to one of two levels to indicate whether the cell has been programmed "on" of " off." "Reading" of the cell's state is accomplished by applying appropriate voltages to the cell source (25) and drain (20), and to control gate (60), and then sensing the amount of charge on floating gate (40). To erase the contents of the cell, the programming process is reversed, namely, charges are removed from the floating gate by transferring them back to the substrate through the gate oxide.

This programming and erasing of an EEPROM is accomplished electrically and in-circuit by using Fowler-Nordheim tunneling as is well known in prior art. Basically, a sufficiently high voltage is applied to the control gate and drain while the source is grounded to create a flow of electrons in the channel region in the substrate. Some of these electrons gain enough energy to transfer from the substrate to the floating gate through the thin gate oxide layer by means of Fowler-Nordheim tunneling. The tunneling is achieved by raising the voltage level on the control gate to a sufficiently high value of about 12 volts. As the electronic charge builds up on the floating gate, the electric field is reduced, which reduces the electron flow. When, finally, the high voltage is removed, the floating gate remains charged to a value larger than the threshold voltage of a logic high that would turn it on. Thus, even when a logic high is applied to the control gate, the EEPROM remains off. Since tunneling process is reversible, the floating gate can be erased by grounding the control gate and raising the drain voltage, thereby causing the stored charge on the floating gate to flow back to the substrate.

In the conventional memory cell shown in FIG. 1, word lines (not shown) are connected to control gate (60) of the MOS transistor, while the length of the MOS transistor itself is defined by the source (25) drain (20) n+ regions shown in the same Figure. As is well known by those skilled in the art, the transistor channel is defined by masking the n+ regions. However, the channel length of the transistor varies depending upon the alignment of the floating gate (40) with the source and drain regions. This introduces significant variations in cell performance from die to die and from wafer to wafer. Furthermore, the uncertainty in the final position of the n+ regions causes variations in the series resistance of the bit lines connected to those regions, and hence additional variation in the cell performance.

In prior art, different methods for fabricating different split-gate memory cells are taught. In U.S. Pat. No. 5,495,441, Hong discloses a split-gate flash memory cell having a vertical isolation gate and a process for making it. The memory cell has a floating gate transistor formed in a substrate having a channel extending underneath a floating ate, and a vertical isolation transistor formed in the substrate having a channel parallel to a trench holding a portion of a polysilicon control gate and orthogonal to the channel of the floating gate. In another U.S. Pat. No. 5,414,287, Hong teaches a process for high density split-gate memory cell for flash or EPROM. Silicon islands are formed from a silicon substrate implanted with a first conductivity-imparting dopant. A first dielectric layer surround the vertical surfaces of the silicon islands, whereby the first dielectric layer is a get oxide. A first conductive layer is formed over a portion of the vertical surfaces of the first dielectric layer, and acts as a floating gate for the high density split-gate memory cell. A source region is located in the silicon substrate. A drain region is located in the top of the silicon islands. A second dielectric layer is formed over the top and side surfaces of the floating gate, and acts as an interpoly dielectric. A second conductive layer is formed over that remaining portion of the vertical surfaces of the first dielectric layer not covered by the first conductive layer, and surrounds the second dielectric layer, whereby the second conductive layer is a control gate.

A different process for trench-isolated self-aligned split-gate EEPROM transistor and memory array is described by Hazani in U.S. Pat. No. 5,162,247. A still different method of manufacturing an EEPROM with trench-isolated bitlines is taught by Gill, et al., in U.S. Pat. No. 5,173,436. Here, an EEPROM cell is constructed using a floating-gate transistor with or without a split gate. In this cell, the bitlines and source/drain regions are buried beneath relatively thick silicon oxide and the floating ate extends over the thick silicon oxide. Programming and erasing are accomplished by causing electron to tunnel through the oxide in a tunnel window. The tunnel window has a thinner dielectric than the remainder of the oxides under the floating gate to allow Fowler-Nordheim tunneling. Trenches and ditches are used for electrical isolation between individual memory cells, allowing an increase in cell density.

In the present invention, a method to increase the coupling ratio of source to floating gate is disclosed without increasing lateral diffusion under the floating gate. This prevents punch-through and junction breakdown problems. The increase in coupling ratio is accomplished by providing a three-dimensional source extending into trench isolation, whereby the vertical wall in the third dimension provides the extra area through which coupling between the source and the floating gate is also increased. It will be appreciated by those skilled in the art that in this manner a higher coupling ratio is achieved without an increase in the cell size.

SUMMARY OF THE INVENTION

It is therefore an object of this invention to provide a method of forming a split-gate flash memory having an increased coupling ratio between source and the floating gate.

It is still another object of this invention to provide a method of forming a split-gate flash memory having a three-dimensional source in order to increase the lateral coupling between the source and the floating gate.

It is yet another object of the present invention to provide a three-dimensional coupling between the source and the floating gate of a split-gate flash memory cell.

It is an overall object of this invention to provide a split-gate flash memory cell of reduced size having three-dimensional source and hence increased three-dimensional coupling between source and the floating gate of the cell.

These objects are accomplished by providing a semiconductor substrate; forming a pad oxide layer over said substrate; forming a first nitride layer over said pad oxide layer; forming and patterning a first photoresist layer over said first nitride layer to define active regions in said substrate; forming a trench in said substrate by etching through patterns in said first photoresist layer and through said first nitride layer; removing said first photoresist layer; forming a conformal lining on the inside walls of said trench; depositing isolation oxide inside said trench to form shallow trench isolation (STI); performing chemical-mechanical polishing of said substrate; removing said first nitride layer; removing said pad oxide layer; forming and patterning a second photoresist layer to define a three-dimensional coupling region in said trench; etching back said oxide in said trench, thus forming a three-dimensional coupling region in the upper portion of said trench; removing said second photoresist layer; forming sacrificial oxide layer over said substrate; removing said sacrificial oxide layer; growing gate oxide layer over said substrate, including the sidewalls of said three-dimensional coupling region in said trench; forming first polysilicon layer over said substrate filling said three-dimensional coupling region in said upper portion of said trench; forming a second nitride layer over said substrate; forming and patterning a third photoresist layer over said second nitride layer to define cell area and form floating gate region in said substrate; etching through said patterning in said third photoresist layer into said second nitride layer until portions of said first polysilicon layer are exposed; removing said third photoresist layer; using patterned said second nitride layer as a mask, oxidizing said exposed portions of said first polysilicon layer to form poly-oxide; removing said second nitride layer; using said poly-oxide as a hard mask, etching said first polysilicon layer to form floating gate; forming inter-poly oxide over said substrate; forming a second polysilicon layer over said interpoly oxide.; forming and patterning a fourth photoresist layer over said substrate to define control gate region over said substrate; etching through said patterning in said fourth photoresist layer into said second polysilicon layer to form said control gate region; removing said fourth photoresist layer; forming and patterning a fifth photoresist layer over said substrate to define source implant region in said substrate; performing source implantation; removing said fifth photoresist layer; forming oxide spacers on side-walls of said control gate; and forming drains of said split-gate flash memory cell.

These objects are further accomplished by providing a split-gate flash memory cell having a floating gate with sidewalls extending into a trench, and thereby providing a three-dimensional coupling with the source of the cell.

BRIEF DESCRIPTION OF THE DRAWINGS

FIG. 1 is a cross-sectional view of a conventional split-gate type memory cell of prior art.

FIG. 5A is a cross-sectional view of the substrate of FIG. 4A showing the forming of the trench, according to this invention.

FIG. 5B is a cross-sectional view of the substrate of Fig, 4B showing the forming of the three-dimensional region in the upper portion of the trench of this invention.

FIG. 5C is a cross-sectional view of the substrate of FIG. 4C showing the photoresist defining of the cell and floating gate of this invention.

FIG. 5D is a cross-sectional view of the substrate of FIG. 4D showing the forming of poly-oxide layer, according to this invention.

FIG. 5E is a cross-sectional view of the substrate of FIG. 4E showing the forming of the floating gate and the extension of the "legs" of the sidewalls of the floating gate into the three-dimensional region of the trench of this invention.

FIG. 5F is a cross-sectional view of the substrate of FIG. 4F showing the forming of the second polysilicon layer over the floating gate of this invention.

FIG. 5G is a cross-sectional view of the substrate of FIG. 4G showing the forming of the three-dimensional source around the three-dimensional region of the trench of this invention, and the resulting three-dimensional coupling between the source and the floating gate, according to this invention.

FIG. 5H is a different cross-sectional view of the substrate of FIG. 4G showing the split-gate flash memory cell of this invention with three-dimensional coupling capability.

DESCRIPTION OF THE PREFERRED EMBODIMENTS

Figure 2A:
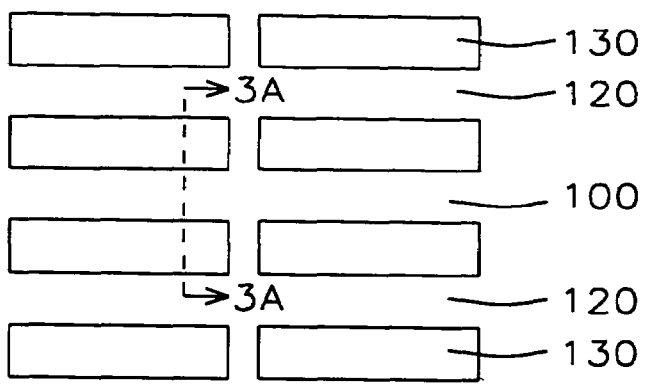
FIGS. 2A-2G are top views of a substrate showing the forming of a split-gate flash memory cell of this invention without the three-dimensional coupling between the source and the floating gate.
Figure 2B:
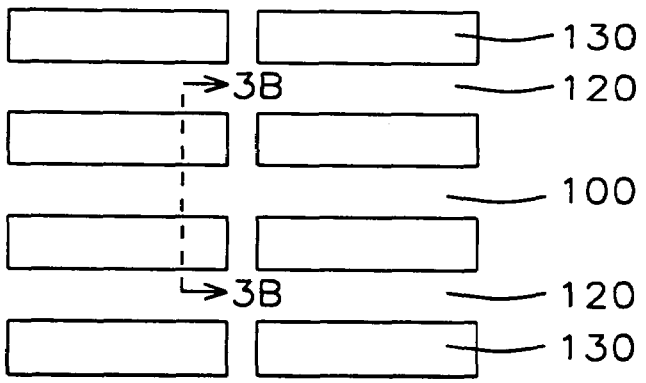

Referring now to the drawings, specifically to FIGS. FIGS. 4A-4H, and FIGS. 5A-5H, there is shown a preferred method of forming a split-gate flash memory having a three-dimensional source capable of three-dimensional coupling with the floating gate of the cell. FIGS. 2A-2H and FIGS. 3A-3H show the present state of manufacturing a split-gate flash memory cell. It will be apparent that the split-gate of FIGS. FIGS. 2A-2H and FIGS. 3A-3H lack the three-dimensional region of the trench of the preferred embodiment where three-dimensional coupling can take place between the floating gate and the source of this invention, as claimed later in the embodiments.

FIGS. 2A-2H show the top view of a semiconductor substrate on which various process steps are performed. Corresponding to each top view, a cross-sectional view of the substrate representing the results of a particular process step is shown in FIGS. 3A-3H.

Figure 3A:
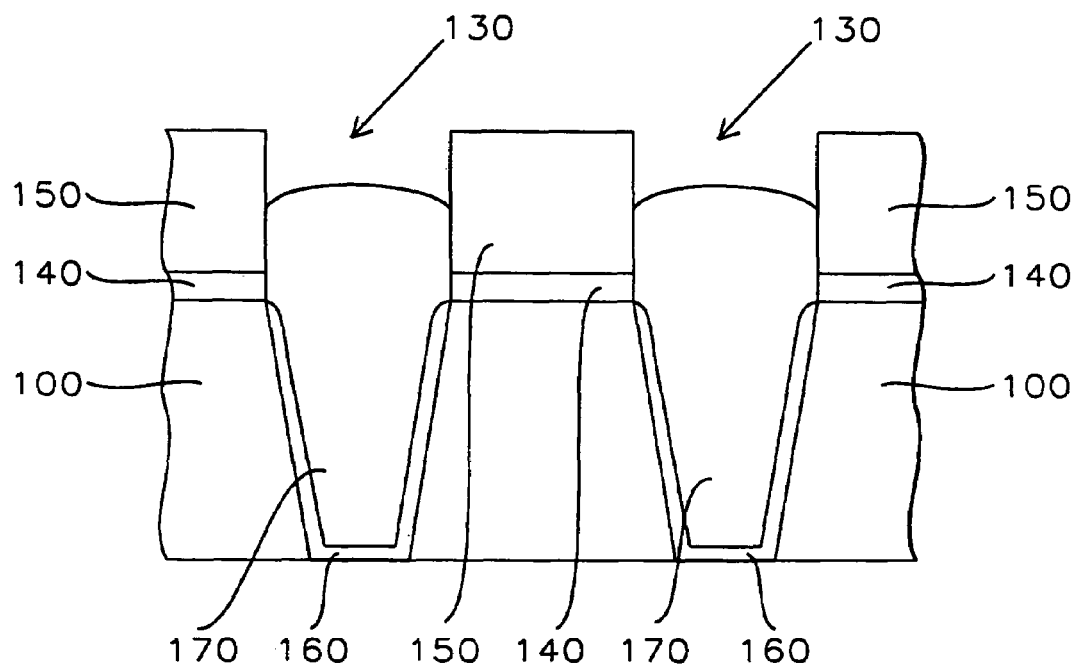
FIGS. 3A-3H correspond to the top views of FIGS. 2A-2H showing the cross-sections of the substrate of this invention without the three-dimensional coupling between the source and the floating gate.

Thus, FIG. 2A shows top view of a semiconductor substrate (100) where active regions (120) and trenches (130) have been defined. A-cross-sectional view of a trench is shown in FIG. 3A. First, a layer of pad oxide (140), better seen in the cross-sectional view, is formed over the substrate. Pad oxide layer may be formed by using chemical CVD $SiO_2$, or grown thermally.

Figure 3B:
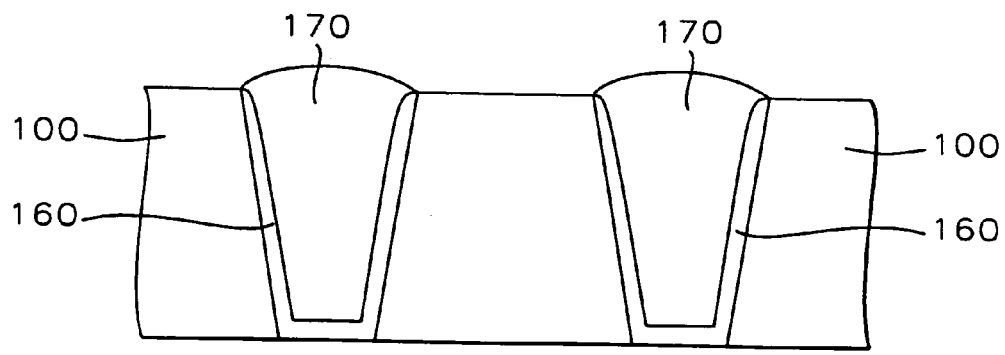

Next, a first nitride layer (150) is formed over the pad oxide. Usually, nitride is formed by reacting dichlorosilane ($SiCl_2H_2$) with ammonia ($NH_3$) in an LPCVD chamber. The active regions are next defined with a photolithographic step and field regions grown, as is well known in the art. A first photoresist pattern is normally used to protect all areas on which active devices will later be formed. The nitride layer is then dry etched, and the pad oxide may be etched by means of either a dry-or wet-chemical process. The etching is further carried into the substrate to form the trench (130) that is shown in FIG. 3A. The photoresist layer is next removed by oxygen plasma ashing and then the inside walls of trench (130) is lined with an oxide layer (160) by thermal growth. Subsequently, the trench is filled with isolation oxide (170), thus forming shallow trench isolation (STI) as shown in FIG. 3A. Next, the substrate is subjected to chemical-mechanical polishing (CMP) after which the nitride layer is removed. The removal of nitride layer can be accomplished in a high-density-plasma (HDP) etcher. The pad oxide layer (140) underlying nitride layer (150) is also removed by using either a dry- or -wet etch. Subsequently, a sacrificial oxide (not shown) is formed and removed, as is practiced in the art, in order to remove any process related damage in the silicon substrate. The resulting structure shows oxide "caps" (170) that protrude above the STI (130) as seen in FIG. 3B, corresponding to the top view shown in FIG. 2B.

Figure 2C:
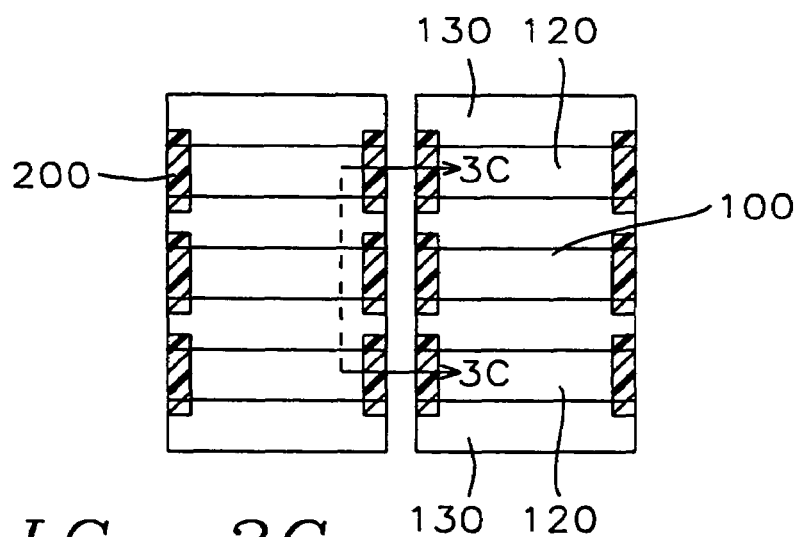
Figure 2D:
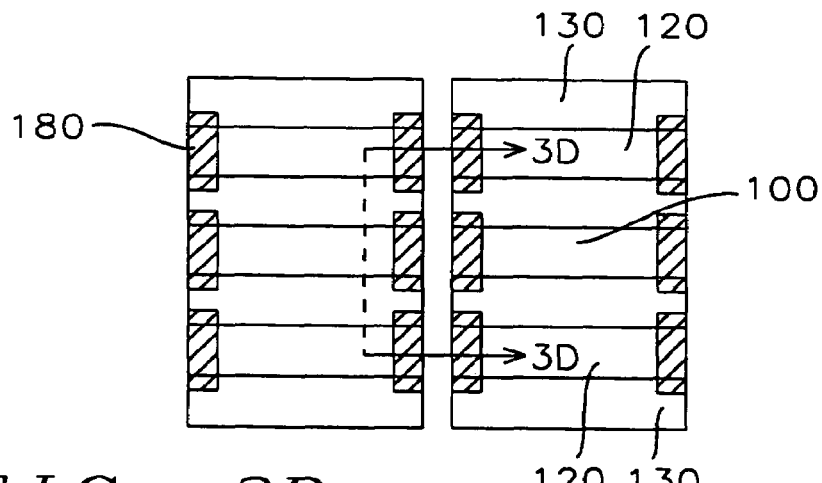
Figure 2E:
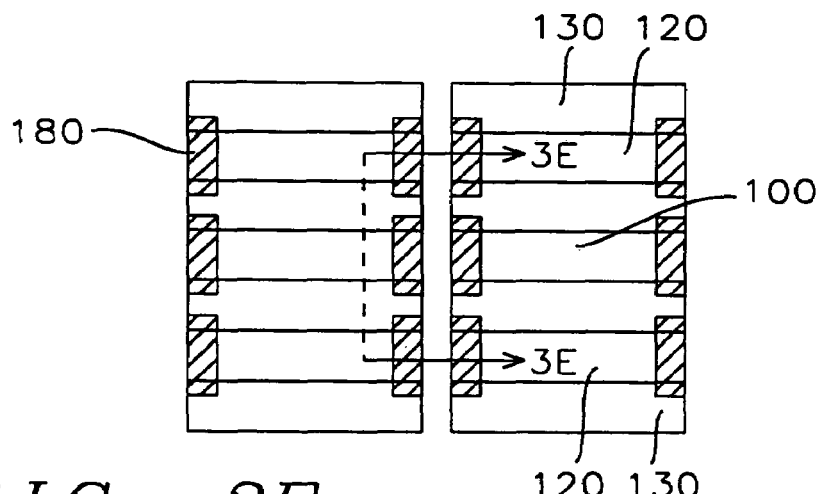
Figure 3C:
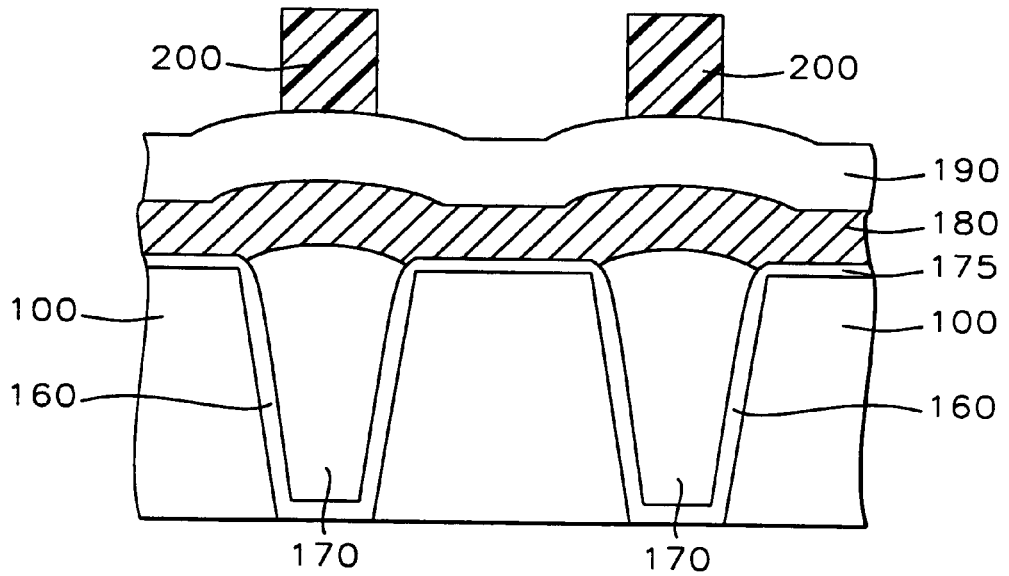
Figure 3D:
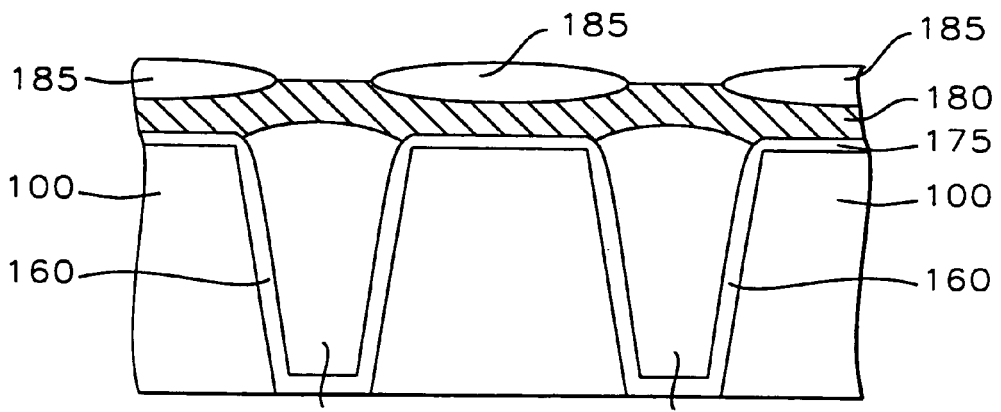
Figure 3E:
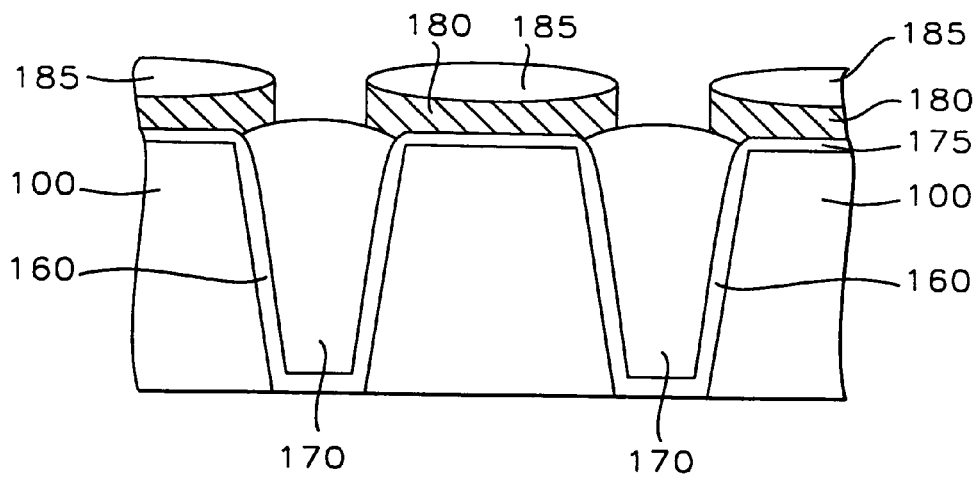

Next, floating gate oxide layer (175) is grown over the substrate, better seen in the cross-sectional view in FIG. 3C corresponding to the top view of the substrate shown in FIG. 2C. Then, a first polysilicon layer (180), later to be formed into a floating gate, is deposited over the gate oxide layer. Polysilicon is formed through methods including but not limited to Low Pressure Chemical Vapor Deposition (LPCVD) methods, Chemical Vapor Deposition (CVD) methods and Physical Vapor Deposition (PVD) sputtering methods employing suitable silicon source materials. This is followed by forming a second nitride layer (190) over the first polysilicon layer (180). The floating gates are next defined by patterning another photoresist layer (200) over the second nitride layer. Second nitride layer is next etched through the patterns of photoresist layer (200) until portions of the fist polysilicon layer are exposed, after which the photoresist layer is removed. Using the patterned second nitride layer as a mask, the exposed portions of the first polysilicon layer is wet oxidized to form poly-oxide (185) as shown in FIG. 3D. The second nitride layer is then removed. The poly-oxide layer (185) then serves as a hard mask to etch the first polysilicon layer to form floating gates (180) as shown in FIG. 3E. Both FIGS. 2D and 2E also show the top view of substrate (100) now having floating gates (180) formed thereon.

Figure 2F:
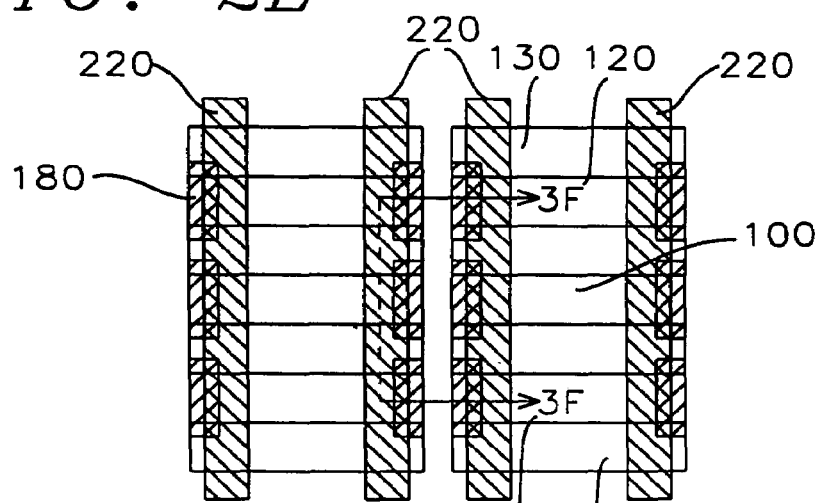
Figure 2G:
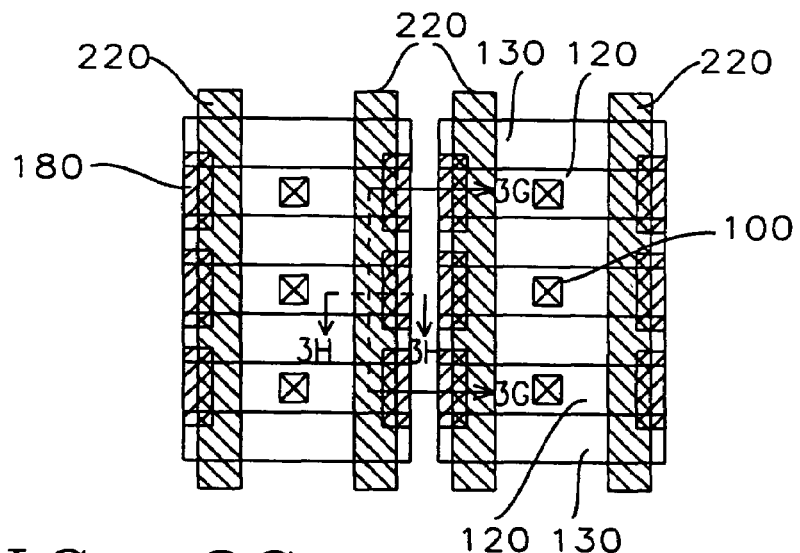
Figure 3F:
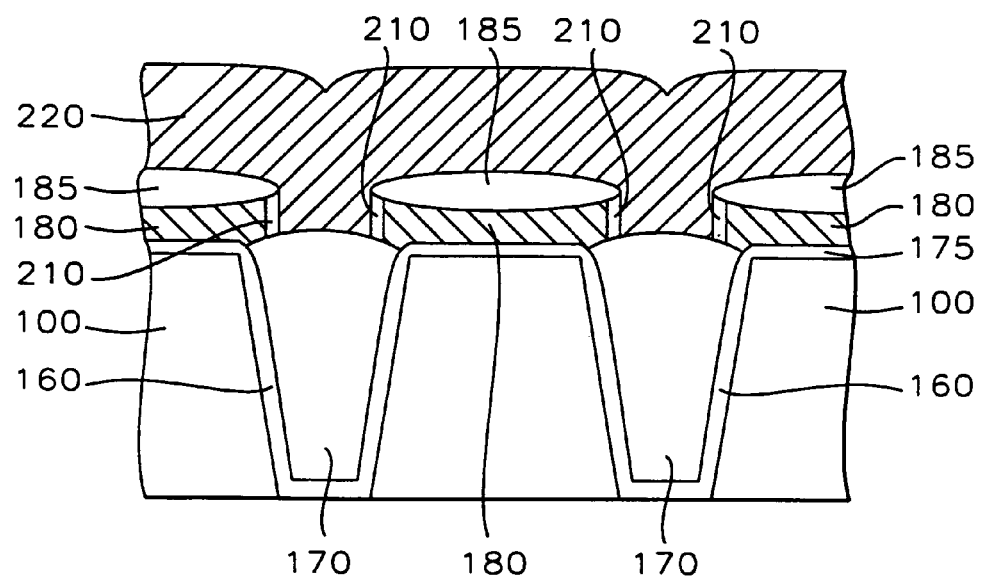
Figure 3G:
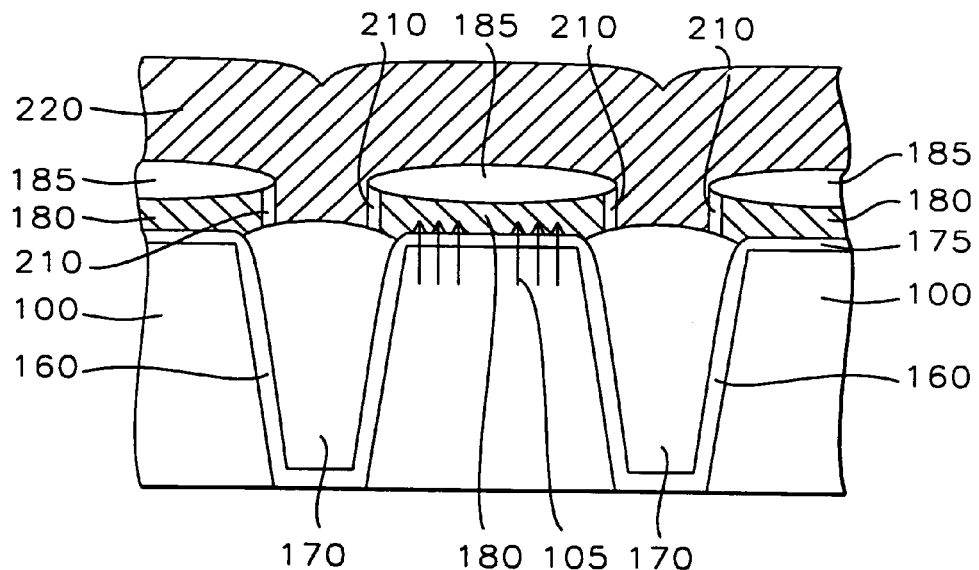
Figure 3H:
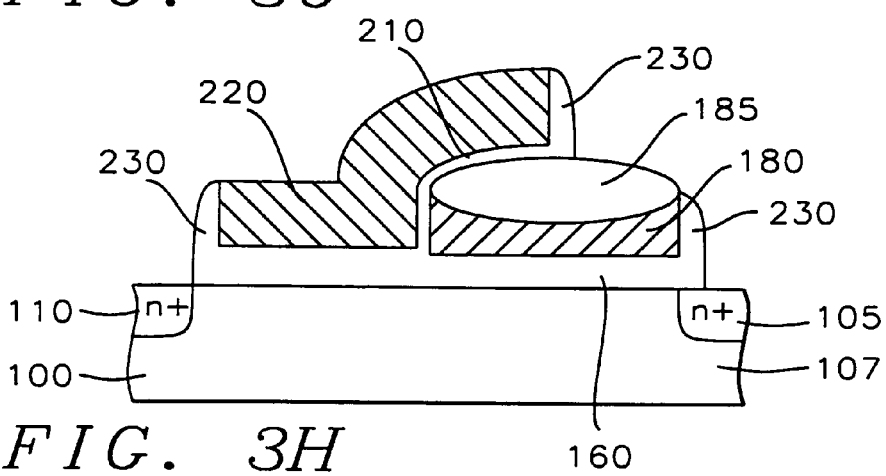
Figure 5A:
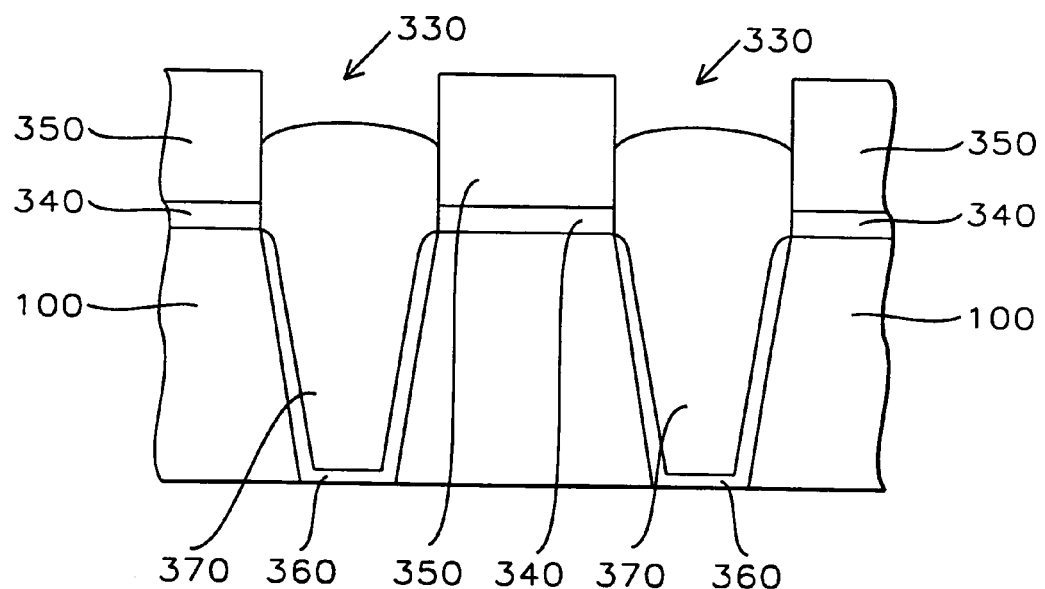
Figure 5B:
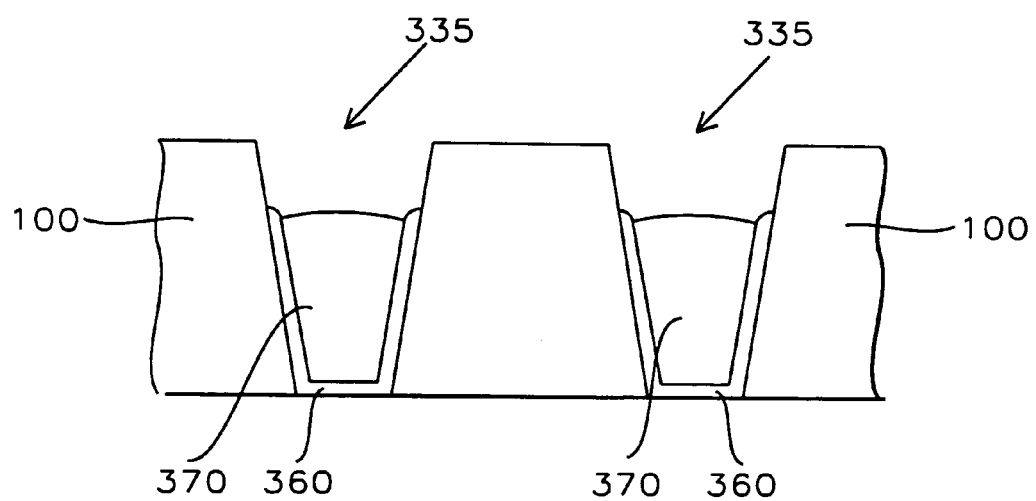

An interpoly oxide (210) is next formed over the floating gate as shown in FIG. 3F, and then a second polysilicon layer (220) is formed over the interpoly oxide as shown both in the top view of the substrate in FIG. 2F, as well as the cross-sectional view, FIG. 3F. Following the normal process steps of forming and patterning another photoresist layer to define the control gate, and etching the second polysilicon layer to form the control gate, a structure is formed as shown in the cross-sectional view in FIG. 3G. Source region (105) shown in FIG. 3G is formed by conventional photoresist defining and the subsequent source implantation. Top view in FIG. 2G better shows the drain regions (110) formed after the forming of oxide spacers (230). A cross-section at 3H shows still better the source (105) and drain (110) regions. However, it is clear in FIG. 3G that the coupling, depicted by arrows, between source (105) and floating gate (180) is two-dimensional in the direction shown. In contrast, it will be shown in the preferred embodiment of this invention that the coupling can be affected three-dimensionally as shown in FIG. 5H.

Figure 4A:
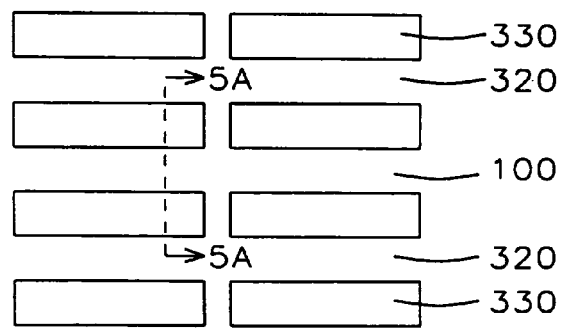
FIGS. 4A-4G are the top views and FIGS. 5A-5H are the corresponding cross-sectional views of the substrate of the preferred embodiment of this invention showing the forming of a split-gate flash memory cell with a three-dimensional coupling capability, specifically.
Figure 4B:
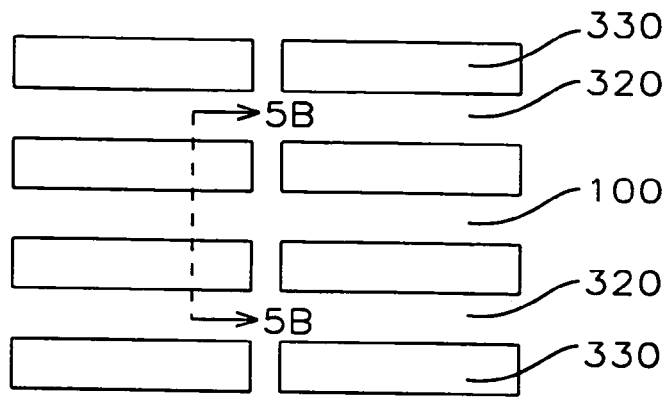
Figure 4C:
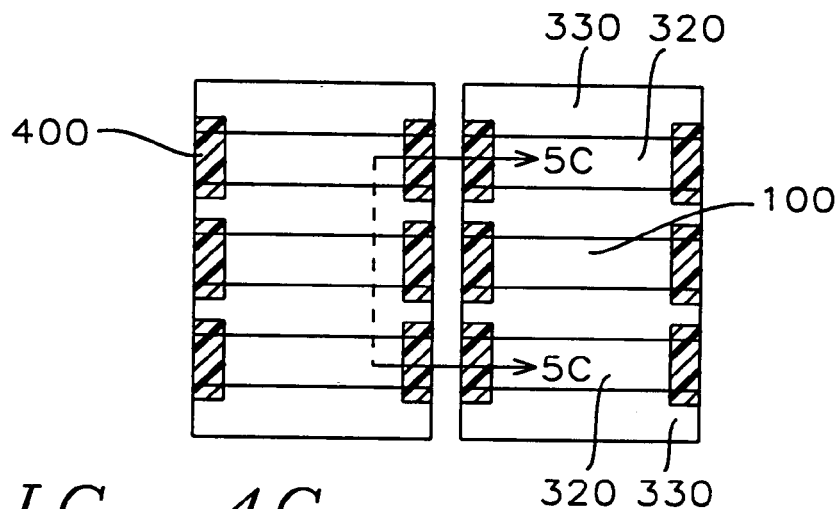
Figure 4D:
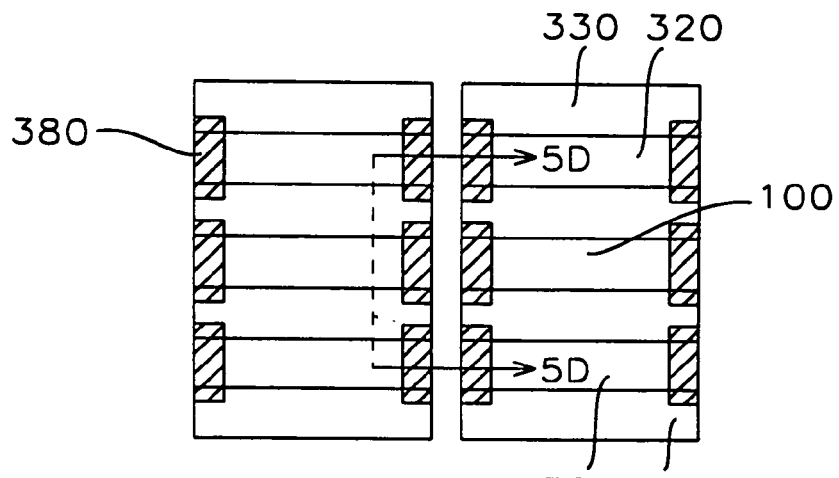
Figure 4E:
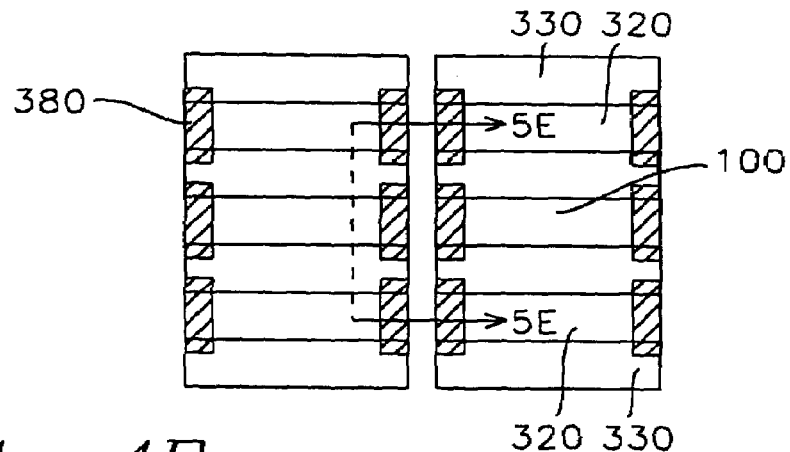
Figure 4F:
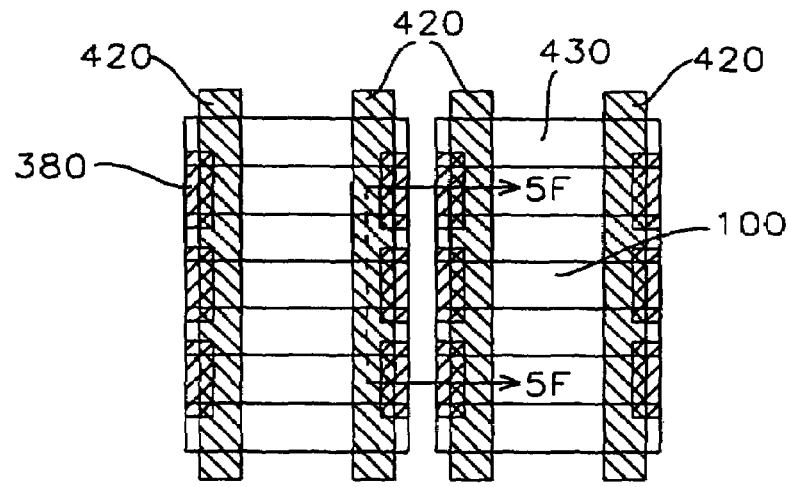
Figure 4G:
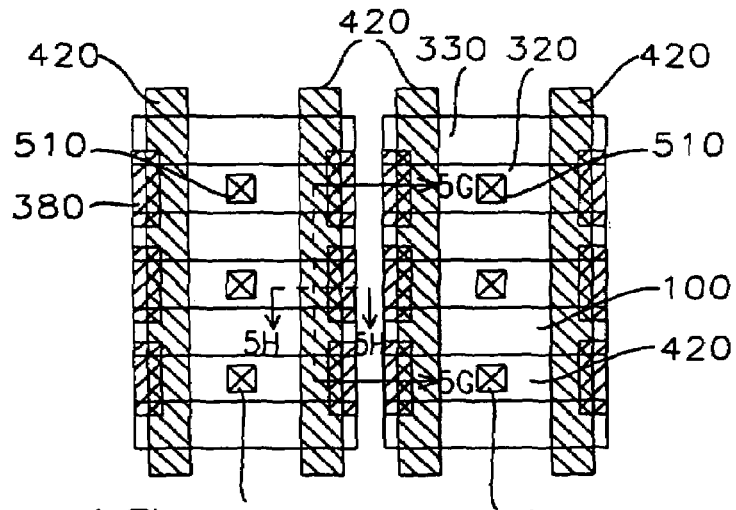

The preferred embodiment shown in FIGS. 4A-4H and 5A-5H differ from the present state of the art in that the source region is formed about a three-dimensional region formed in the upper portion of a trench. Thus, in FIG. 4A, the top view of substrate (100), shows regions (330) where shallow trench isolation (STI) are to be formed. First, a layer of pad oxide (340), better seen in the cross-sectional view, FIG. 5A, is formed over the substrate. It is preferred that the pad oxide is grown thermally at a temperature range between about 850 to 950° C., and to a thickness between about 100 to 250 Å.

Next, a first layer of nitride (350) is formed over the pad oxide. Preferably, the thickness of nitride layer (350) is between about 1200 to 2500 Å, and that it is formed by reacting dichlorosilane ($SiCl_2H_2$) with ammonia ($NH_3$) in an LPCVD at a temperature between about 750 to 850° C.

The active regions are next defined with a photolithographic step (not shown) and field regions grown, as is conventionally performed. A photoresist pattern is normally used to protect all areas on which active devices will later be formed. The nitride layer is then dry etched, preferably using a recipe comprising $SF_6$ and $O_2$, and the underlying pad oxide is also etched by means of $CF_4$, $CHF_3$ and $O_2$. The etching is further carried into the substrate to form the shallow trench (330) that is shown in FIG. 5A by using a recipe comprising $Cl_2$, HBr, $CHF_3$ and $O_2$.

The first photoresist layer is next removed by oxygen plasma ashing and then the inside walls of trench (330) is lined with an oxide layer (360) by thermal growth, preferably at a temperature between about 850 to 950° C. Subsequently, the trench is filled with isolation oxide (370), using method of LPCVD (Low Pressure Chemical Vapor Deposition), or HDP (High Density Plasma), thus forming shallow trench isolation (STI) as shown in FIG. 5A. Next, the substrate is subjected to chemical-mechanical polishing (CMP). After CMP, nitride layer (350), as well as the pad oxide layer (340) are removed, leaving nitride "caps" (370) protruding over trenches (330). It is preferred that the removal of nitride is accomplished in an HDP etcher with etch recipe comprising gases $O_2$, $SF_6$, $CF_4$ and He. The pad oxide layer (340) underlying nitride layer (350) is also removed preferably by using wet or dry etch.

As a main feature and key aspect of the present invention, the next step involves the forming of a three-dimensional coupling region with sidewalls reaching into the upper portion of trench (330) shown in FIG. 5A. This is accomplished by forming a second photoresist layer (not shown) and patterning it with openings over trenches (330). Oxide protrusions (370) are then etched, preferably with an etch recipe comprising 10:1 buffered oxide etch (BOE) or hydrofluoric, HF solution, to form coupling regions (335), as shown in FIG. 5B. The cross-section 5B taken on the substrate is shown in the top view in FIG. 4B. After the forming of regions (335), the second photoresist layer is removed. Prior to the forming of the gate oxide layer, and as is known in the art, a sacrificial oxide layer (not shown) is formed and removed in order to also remove any damages that may have occurred in the silicon substrate during the previous process steps.

Figure 5C:
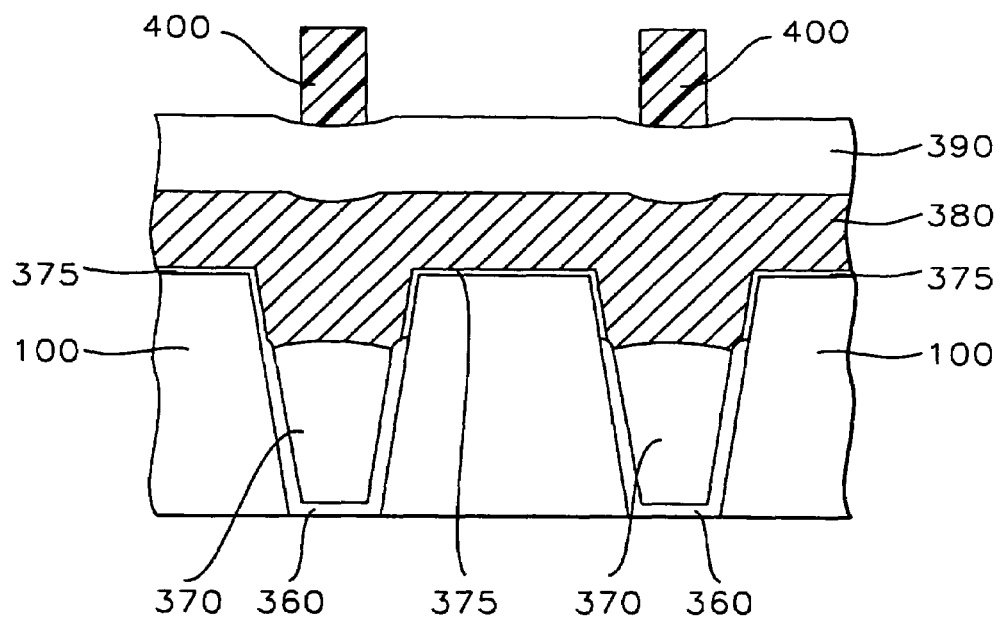
Figure 5D:
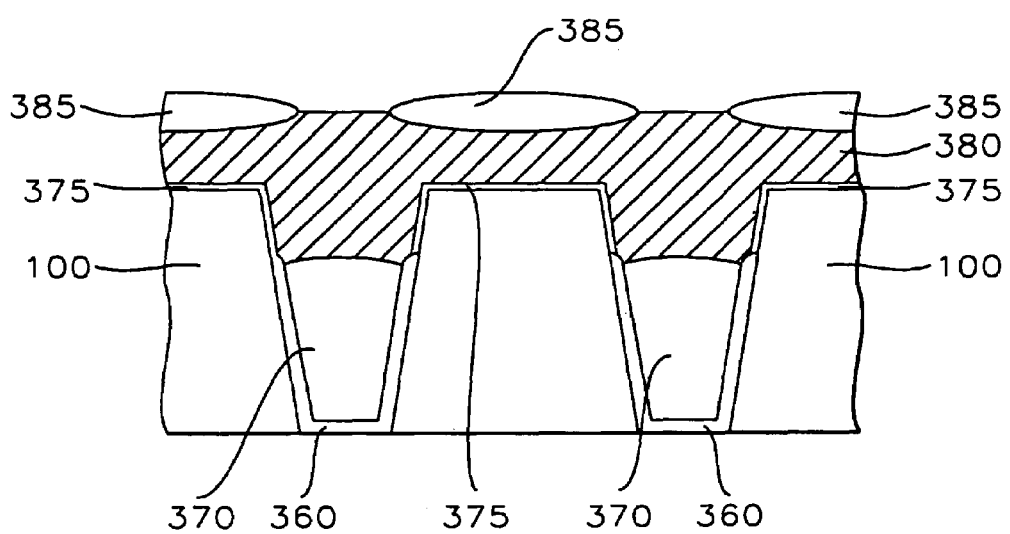

Next, floating gate oxide layer (375) is grown over the substrate, including the sidewalls of the three-dimensional region (335), at a temperature between about 800 to 950° C., as shown in FIG. 5C. Subsequently, a first polysilicon layer (380), to serve as a floating gate, is deposited over the substrate, filling regions (335). This is accomplished preferably through a LPCVD method employing silane $SiH_4$ as a silicon source material at a temperature range between about 500 to 650° C. Subsequently, a second nitride layer (390) is formed over the first polysilicon layer also by reacting dichlorosilane ($SiCl_2H_2$) with ammonia ($NH_3$) in an LPCVD at a temperature between about 700 to 850° C. This is followed by forming and patterning a third photoresist layer, (400), to define the floating gate cell regions. Photoresist layer (400) is also shown in the top view of FIG. 4C.

The second nitride layer (390) is next patterned by etching through the patterns in photoresist layer (400) until portions of first polysilicon layer (380) are exposed. The etching of nitride layer (390) is accomplished with a recipe comprising $CF_4$, $CHF_3$, $O_2$, $SF_6$. Photoresist layer is then removed by oxygen plasma ashing. The portions of the first polysilicon layer exposed at the bottom of openings in the second nitride layer are wet-oxidized, forming poly-oxide (385), and subsequently, nitride layer (390) is removed using another recipe comprising $H_3PO_4$ solution.

Figure 5E:
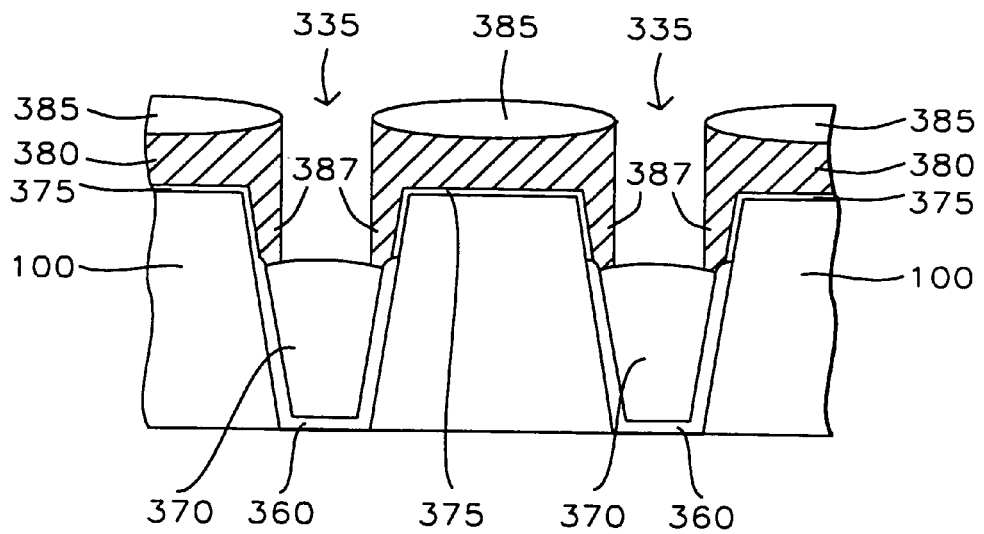
Figure 5F:
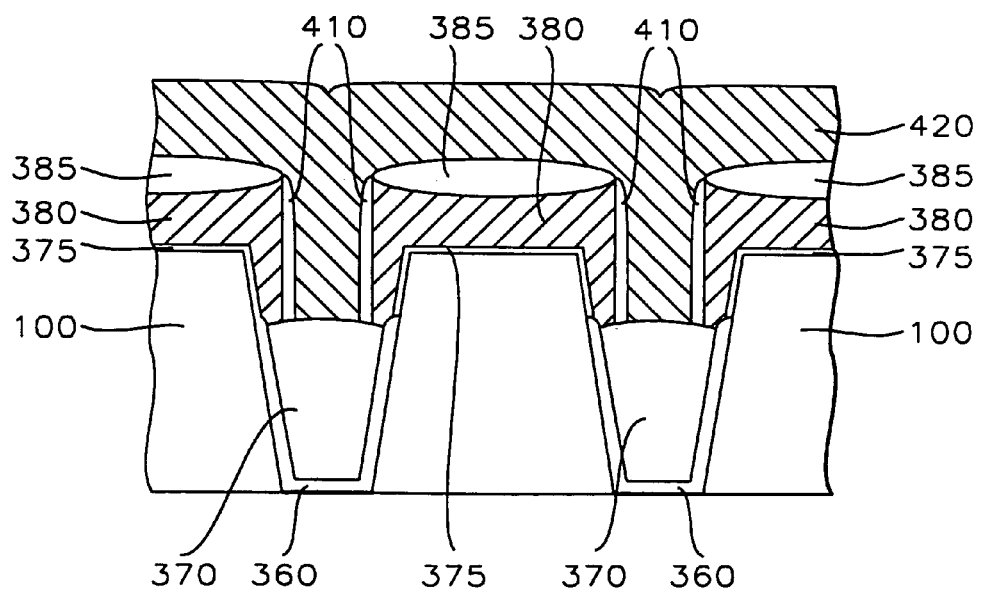

Floating gate (380) is next formed by etching the first polysilicon layer using poly-oxide (385) as hard-mask as shown in FIG. 5E. The etching is accomplished with a recipe comprising HBr, $O_2$ and $CL_2$. Section 5E taken on substrate (100) is shown in the top view of FIG. 4E. It will be noted in FIG. 5E that the first polysilicon layer is etched reaching into the three-dimensional coupling region (335). Thus, floating gate (380) forms "legs" (387) extending from its sidewalls, which surround the source region (305) that is to be formed at a later step. An interpoly oxide (410) is next formed conformally over the sidewall and legs of the floating gate as shown in FIG. 5F. It is preferred that the interpoly oxide is formed through methods of thermal growth or hot temperature oxidation. Then, a second polysilicon layer (420) is formed using the same process as for the first polysilicon layer over the interpoly oxide as shown both in the top view of the substrate in FIG. 4F, as well as the cross-sectional view, FIG. 5F. A fourth photoresist layer (not shown) is used to define the control gate of the memory cell. The second polysilicon layer is etched to form control gate (420) by using a recipe comprising HBr, $O_2$ and $Cl_2$. A fifth photoresist layer (also not shown) is used conventionally to define the source and source implantation is accomplished by using phosphorus ions at a dosage level between about $1 \times 10^{15}$ to $1 \times 10^{16}$ atoms/$cm^2$ and energy level between about 20 to 60 KEV. Similarly, drain implantation is performed following the conventional forming of spacers, such as spacers (500) shown in FIG. 5H around the sidewalls of the control gate by depositing oxide and etching anisotropically. The drain implantation is accomplished by using arsenic ions at a dosage level between about $1\times10^{15}$ to $1\times10^{16}$ atoms/cm$^2$ and energy level between about 20 to 60 KEV. Drain regions (510) are shown in the top view of FIG. 4G, while the source region (405) is better seen in the cross-sectional view of FIG. 5G. A different cross-sectional view taken at section 5H shown in the top view of FIG. 4G is shown in FIG. 5H where the split-gate cell of this invention is clearly seen.

Figure 5G:
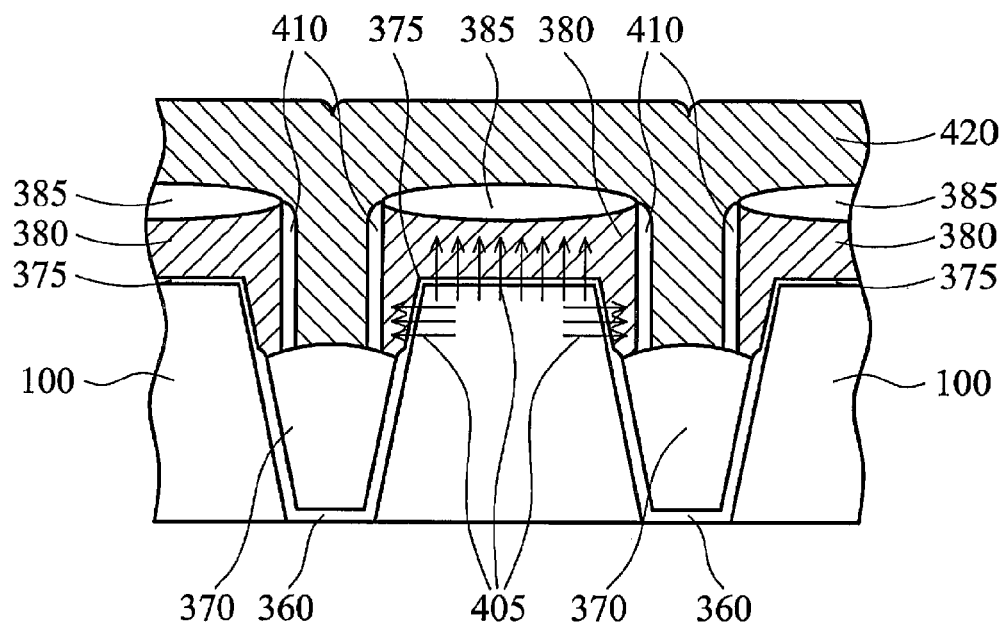
Figure 5H:
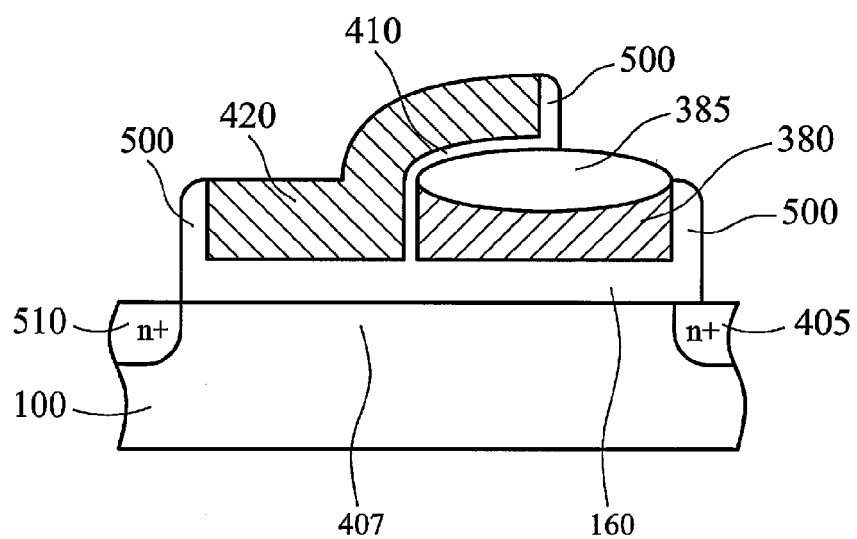

A comparison of FIG. 5G with FIG. 3G show that the coupling between source (405) and floating gate (380) of this invention is affected three-dimensionally, as schematically depicted by vertical and lateral arrows in the same Figure, by virtue of the extension of the legs from the sidewall of the floating gate into the three-dimensional coupling region (335) of trench (330). The leg or the side-wall of the floating gate forming the third dimension provides the extra area through which coupling between the source and the floating gate is increased. In this manner, a higher coupling ratio is achieved without an increase in the cell size while at the same time alleviating the punchthrough and junction break-down of source region by sharing gate voltage along the side-wall.

While the invention has been particularly shown and described with reference to the preferred embodiments thereof, it will be understood by those skilled in the art that various changes in form and details may be made without departing from the spirit and scope of the invention.

What is claimed is:

1. A split-gate flash memory cell having a three-dimensional source capable of three-dimensional coupling with a floating gate of the cell comprising:

two trenches in a substrate;

a source region between said two trenches;

an isolation layer in said trenches, said isolation layer filling a bottom portion of said trenches, wherein said isolation layer in the trench does not cover an upper portion of said trench;

a three-dimensional coupling region surrounding the upper portions of said trenches;

a floating gate dielectric covering the substrate between said two trenches, including side-walls of the upper portion of said trenches;

a floating gate with side-walls reaching into said three-dimensional coupling region in said trench;

an inter-gate dielectric covering the side-walls of said floating gate;

a conductive layer covering said inter-gate dielectric to form a control gate; and drain regions of said split-gate flash memory cell.

2. The split-gate flash memory cell of claim 1, wherein said three-dimensional coupling region in the upper portion of said trench has a height between about 2000 to 5000 Å.

3. The split-gate flash memory cell of claim 1, further comprising a conformal layer lining the inside walls of said trenches.

4. The split-gate flash memory cell of claim 1, wherein said isolation layer comprises an oxide.

5. The split-gate flash memory cell of claim 1, wherein said floating gate has a thickness between about 800 to 1500 Å.

6. The split-gate flash memory cell of claim 1, wherein said inter-gate dielectric comprises oxide-nitride-oxide (ONO).

7. The split-gate flash memory cell of claim 1, wherein said conductive layer comprises polysilicon.

8. The split-gate flash memory cell of claim 1, wherein said control gate has a thickness between about 1000 to 3000 Å.

9. The split-gate flash memory cell of claim 1, wherein the floating gate dielectric is between said three-dimensional coupling region and the floating gate.

10. The split-gate flash memory cell of claim 9, wherein the floating gate dielectric comprises a thermally grown oxide.

11. The split-gate flash memory cell of claim 1, wherein the inter-gate dielectric comprises an interpoly oxide.

12. The split-gate flash memory cell of claim 1, further comprising a mask pattern covering the top surface of the floating gate, underlying the control gate.

13. The split-gate flash memory cell of claim 12, wherein the mask pattern comprises poly-oxide.

14. The split-gate flash memory cell of claim 3, wherein said conformal lining layer comprises oxide having a thickness between about 100 to 450 Å.

15. The split-gate flash memory cell of claim 1, further comprising spacers on sidewalls of said control gate.

16. The split-gate flash memory cell of claim 1, wherein said spacers comprises oxide.

* * * * *